United States Patent
Ho et al.

(10) Patent No.: US 11,777,191 B2
(45) Date of Patent: Oct. 3, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Yu Ho, Kaohsiung (TW); Sheng-Chi Hsieh, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 36 days.

(21) Appl. No.: 17/133,369

(22) Filed: Dec. 23, 2020

(65) Prior Publication Data

US 2022/0200130 A1  Jun. 23, 2022

(51) Int. Cl.
*H01Q 1/22* (2006.01)
*H01L 23/66* (2006.01)
*H01Q 1/52* (2006.01)
*H01Q 25/00* (2006.01)

(52) U.S. Cl.
CPC .......... *H01Q 1/2283* (2013.01); *H01L 23/66* (2013.01); *H01Q 1/523* (2013.01); *H01Q 25/005* (2013.01); *H01L 2223/6677* (2013.01)

(58) Field of Classification Search
CPC .... H01Q 1/2283; H01Q 1/523; H01Q 25/005; H01L 23/66; H01L 2223/6677
See application file for complete search history.

(56) References Cited

U.S. PATENT DOCUMENTS

| 10,205,222 | B2 | 2/2019 | Chen et al. | |
| 11,239,573 | B2* | 2/2022 | Shah | H01Q 21/08 |
| 2020/0091581 | A1* | 3/2020 | Ou | H01Q 21/065 |
| 2021/0143525 | A1* | 5/2021 | Kim | H01Q 1/085 |

* cited by examiner

*Primary Examiner* — Robert Karacsony
(74) *Attorney, Agent, or Firm* — FOLEY & LARDNER LLP

(57) ABSTRACT

The present disclosure relates to a wireless communication module. The wireless communication module includes a first antenna layer and a second antenna layer non-coplanar with the second antenna layer. An electromagnetic wave of the first antenna and the second antenna are configured to have far-field interference to each other.

8 Claims, 11 Drawing Sheets

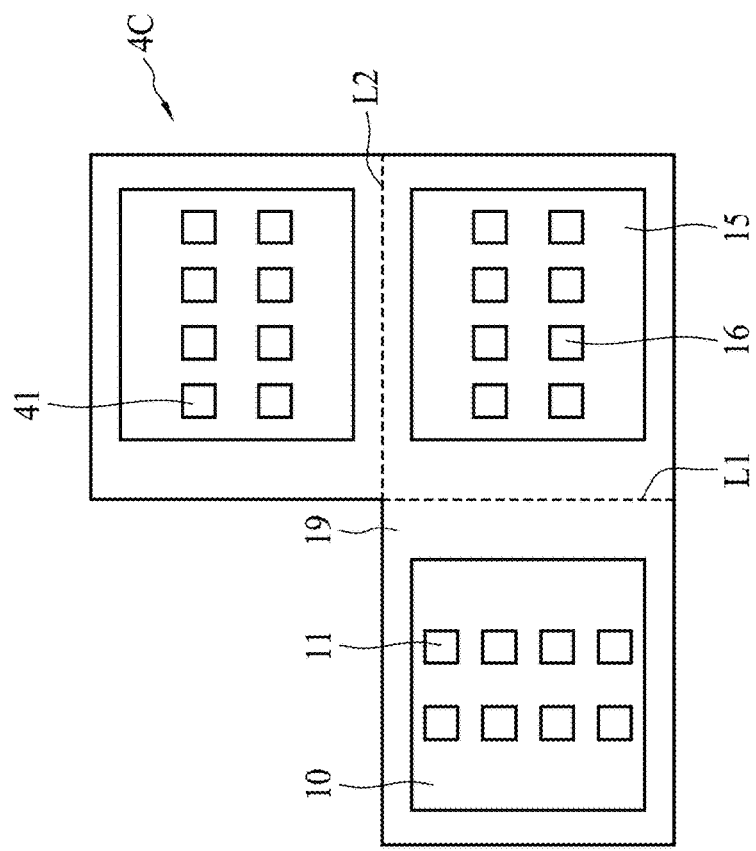
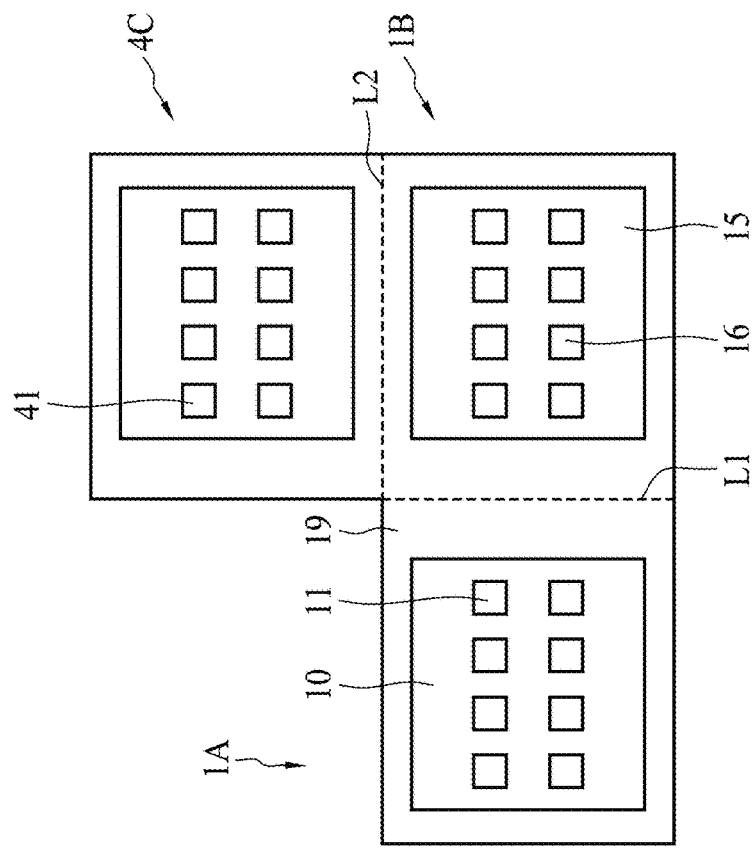
FIG. 4C
FIG. 4D

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna structure and a method of manufacturing the same.

2. Description of the Related Art

Wireless communication devices, such as cell phones, tablets, notebooks, smart watches, or the like, typically include antennas for transmitting and receiving radio frequency (RF) signals. In order to achieve higher bandwidth, lower latency, and higher data transmission rates in wireless communication devices, millimeter wave frequency bands have been introduced. However, the millimeter wave transmission introduces many technical challenges. One major problem is high path loss when the signal propagates. Therefore, directional antennas are commonly used in wireless communication devices to increase gain of the signal. However, configuration of multiple directional antennas radiating in various directions requires a wireless communication device to be equipped with multiple antenna modules, increasing the cost and the size of the wireless communication device.

SUMMARY

In accordance with some embodiments of the present disclosure, a wireless communication module includes a first antenna layer and a second antenna layer non-coplanar with the second antenna layer. An electromagnetic wave of the first antenna and the second antenna are configured to have far-field interference to each other.

In accordance with some embodiments of the present disclosure, a wireless communication module includes a carrier and substrate. The carrier includes a first surface and a second surface non-parallel with the first surface. The substrate includes a first portion disposed on the first surface of the carrier and a second portion disposed on the second surface of the carrier. The first portion includes a first antenna layer, and the second portion includes a second antenna layer. The first antenna layer and the second antenna layer are configured as a first antenna array.

BRIEF DESCRIPTION OF THE DRAWINGS

FIG. 4C illustrates a net of the wireless communication module as shown in FIG. 4A, in accordance with some embodiments of the present disclosure.

FIG. 4D illustrates a net of the wireless communication module as shown in FIG. 4B, in accordance with some embodiments of the present disclosure.

Figure 1A:
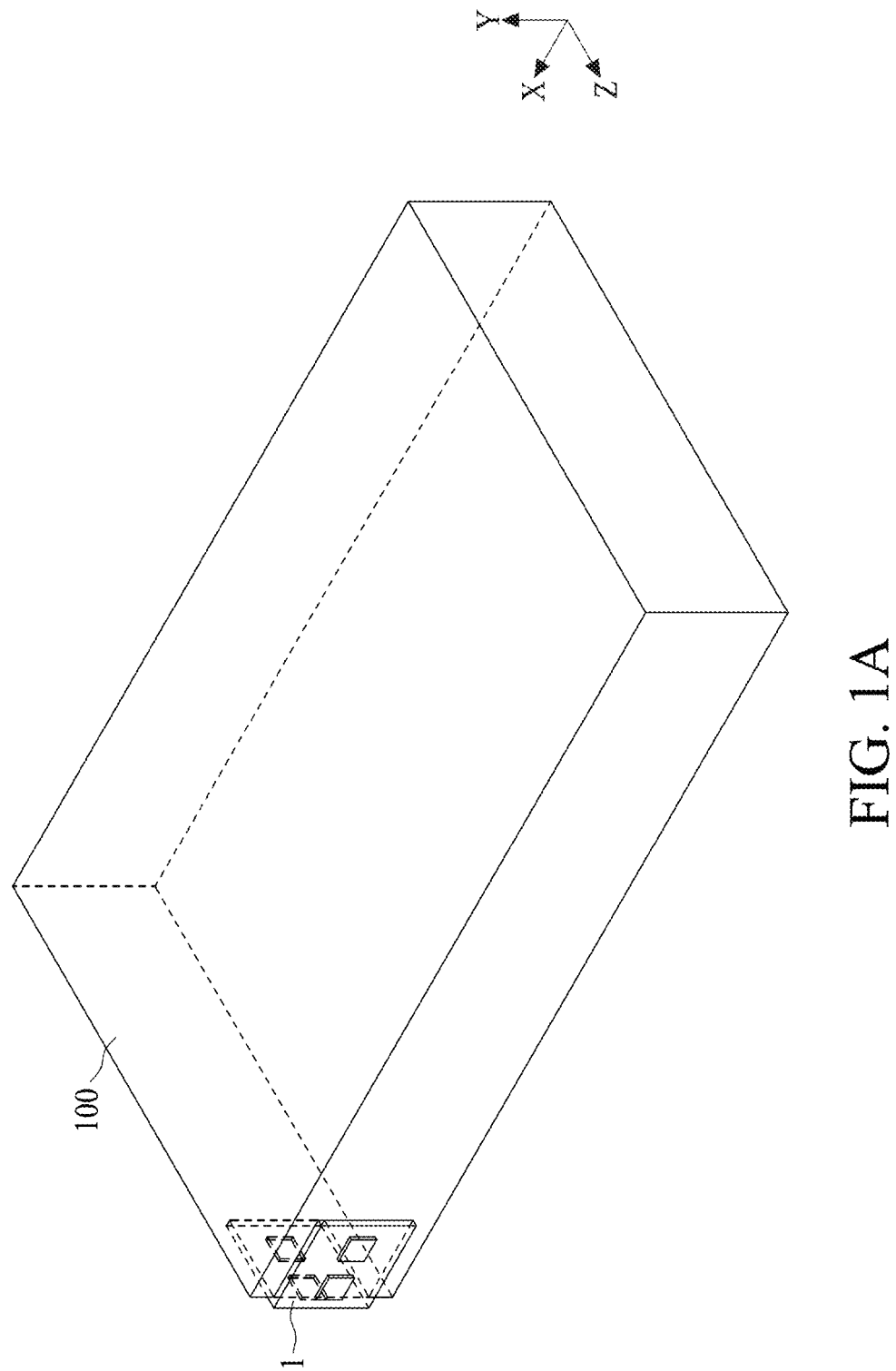
FIG. 1A illustrates a perspective view of an electronic device, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a perspective view of an electronic device 100, in accordance with some embodiments of the present disclosure. The electronic device 100 can be configured for wireless transmission. In some embodiments, the electronic device 100 may be or include, for example, a cell phone, a tablet, a notebook, a smart watch, or any other electronic components capable of wireless transmission.

Figure 3B:
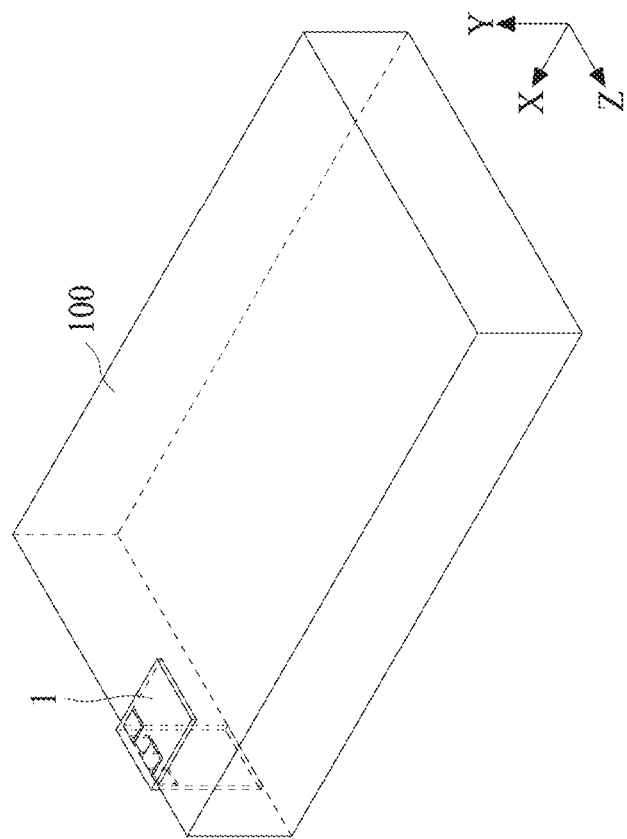
FIG. 3B illustrates a perspective view of an electronic device, in accordance with some embodiments of the present disclosure.
Figure 3A:
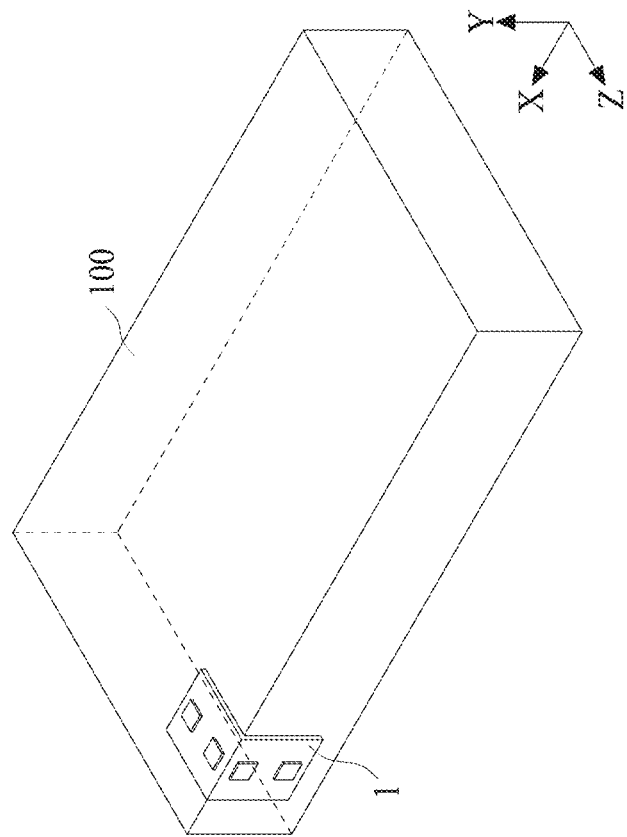
FIG. 3A illustrates a perspective view of an electronic device, in accordance with some embodiments of the present disclosure.

The electronic device 100 has a wireless communication module 1 disposed on at least two surfaces of the electronic component 100. In some embodiments, the wireless communication module 1 is disposed on two adjacent surfaces of the electronic device 100. For example, as shown in FIG. 1A, the wireless communication module 1 is disposed on the surface of the electronic device 100 perpendicular to the x-axis and the surface perpendicular to the z-axis. For example, as shown in FIG. 3A, the wireless communication module 1 is disposed on the surface of the electronic device 100 perpendicular to the y-axis and the surface perpendicular to the z-axis. For example, as shown in FIG. 3B, the wireless communication module 1 is disposed on the surface of the electronic device 100 perpendicular to the x-axis and the surface perpendicular to the y-axis.

Figure 1B:
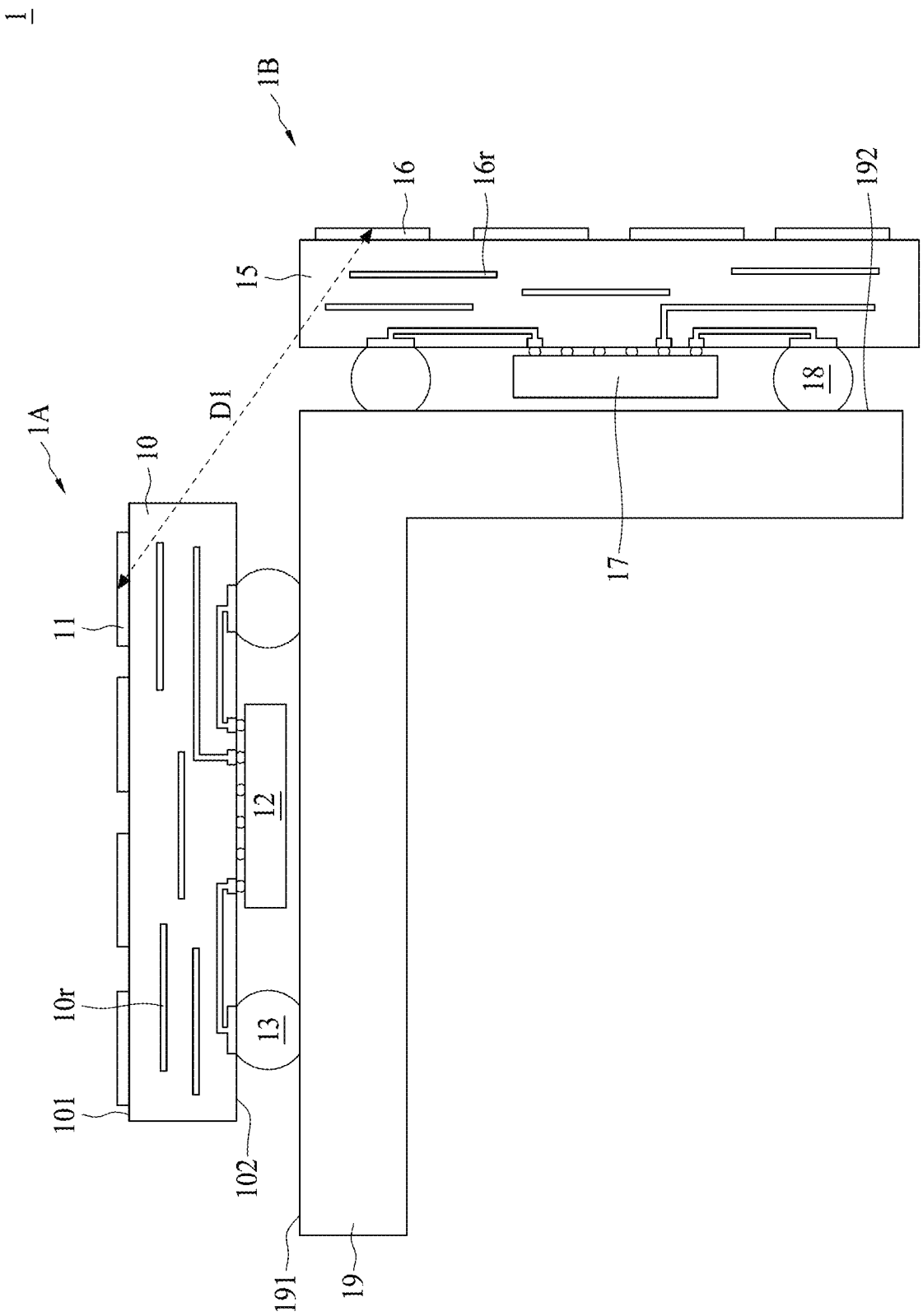
FIG. 1B illustrates a side view of a wireless communication module, in accordance with some embodiments of the present disclosure.

FIG. 1B illustrates a side view of the wireless communication module 1 along the y-axis as shown in FIG. 1A, in accordance with some embodiments of the present disclosure. The wireless communication module 1 includes a substrate 19 and antenna modules 1A and 1B.

The substrate 19 is disposed on the surfaces of the electronic device 100 and electrically connected to the electronic device 100. The substrate 19 may be, for example, a printed circuit board, such as a paper-based copper foil laminate, a composite copper foil laminate, or a polymer-impregnated glass-fiber-based copper foil laminate. The substrate 19 may include an interconnection structure, such as a redistribution layer (RDL) or a grounding element. In some embodiments, the substrate 19 may be a single-layer substrate or multi-layer substrate. In some embodiments, the substrate 19 may be or include a flexible printed circuit board (FPC). Hence, the substrate 19 can be bent or folded as shown in FIG. 1B to be conformal to the surfaces of the electronic device 100. The substrate 19 has a surface 191 and a surface 192 which is not coplanar with the surface 191. For example, the surface 191 is substantially perpendicular to the surface 192. The surface 191 and the surface 192 can also define any angle other than 90 degrees depending on the shape of the electronic device 100. The surface 191 and the surface 192 can define an angle greater than 0 degree and less than 180 degrees. In some embodiments, the substrate 19 may be omitted, and the antenna module 1A and the antenna module 1B are directly disposed on the surfaces of the electronic device 100. In some embodiments, the substrate 19 may be or include a housing of the electronic device 100.

The antenna module 1A is disposed on the surface 191 of the substrate 19 and electrically connected to the substrate 19. The antenna module 1A includes a substrate 10, an antenna layer 11, an electronic component 12, and an electrical contact 13.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10r, such as a RDL or a grounding element. In some embodiments, the substrate 10 may be a single-layer substrate or multi-layer substrate. The substrate 10 has a surface 101 facing away from the substrate 19 and a surface 102 opposite to the surface 101.

The antenna layer 11 is disposed on the surface 101 of the substrate 10. The antenna layer 11 includes a patterned antenna, such as a directional antenna or an omnidirectional antenna. For example, the antenna layer 11 may include a patch antenna. In some embodiments, the antenna layer 11 includes an antenna array. For example, the antenna layer 11 may include M×N antennas, where each of M and N is a positive integer. The antenna layer 11 is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

In some embodiments, a pitch between two adjacent antennas (e.g., a distance between a center of one antenna and a center of an adjacent antenna) of the antenna layer 11 is in a range from about $0.5\lambda$ to about $0.9\lambda$, where $\lambda$ represents the wavelength of the electromagnetic waves transmitted or received by the antenna layer 11. In some embodiments, the pitch between two adjacent antennas of the antenna layer 11 is in a range from about $0.5\lambda$ to about $0.7\lambda$. In addition, $\lambda = f \times c$, where f represents an operating frequency of the antenna layer 11 or the antenna layer 16, and c represents the transmission speed of the electromagnetic waves. In some embodiments, an offset (or tolerance) of the pitch between two adjacent antennas of the antenna layer 11 is equal to or less than $0.1\lambda$. In some embodiments, the electromagnetic waves transmitted by two adjacent antennas of the antenna layer 11 have a phase shift of about 45 degrees to about 55 degrees.

The electronic component 12 is disposed on the surface 102 of the substrate 10 and electrically connected to the substrate 10. The electronic component 12 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 12 can be electrically connected to the substrate 10 through flip-chip or wire-bond techniques. The electronic component 12 is electrically connected to the antenna layer 11 through the substrate 10 for signal transmission (e.g., feeding signal). In some embodiments, the electronic component 12 is configured to control or determine the phase (or the phase shift) of the signal transmitted to each antenna of the antenna layer 11, so as to achieve the beam forming effect through far-field interference between the antenna layer 11 and the antenna layer 16 and to control radiated directions of electromagnetic waves emitted by the antenna layer 11 and the antenna layer 16.

The electrical contacts 13 (e.g., solder balls, conductive pillars, conductive bumps, or the like) are electrically connected to the substrate 10 to provide electrical connections between the antenna module 1A and the substrate 19.

The antenna module 1B is disposed on the surface 192 of the substrate 19 and electrically connected to the substrate 19. The antenna module 1B includes a substrate 15, an antenna layer 16, an electronic component 17, and an electrical contact 18. The antenna module 1B is the same as or similar to the antenna module 1A, and the descriptions of the substrate 10, the antenna layer 11, the electronic component 12, and the electrical contact 13 are applicable to the substrate 15, the antenna layer 16, the electronic component 17, and the electrical contact 18.

The antenna module 1A and the antenna module 1B are not disposed on the same plane. The antenna layer 11 of the antenna module 1A and the antenna layer 16 of the antenna module 1B are not disposed on the same plane. The surface (e.g., the surface 191) on which the antenna module 1A (or the antenna layer 11) is disposed is not coplanar to the surface (e.g., the surface 192) on which the antenna module 1B (or the antenna layer 16) is disposed. The antenna layer 11 of the antenna module 1A and the antenna layer 16 of the antenna module 1B are configured to transmit or receive electromagnetic waves in different directions. For example, the antenna layer 11 of the antenna module 1A is configured to transmit or receive electromagnetic waves mainly in a direction substantially perpendicular to the surface 191 of the substrate 19 (e.g., along a normal of the surface 191 of the substrate 19). The antenna layer 16 of the antenna module 1B is configured to transmit or receive electromagnetic waves mainly in a direction substantially perpendicular to the surface 192 of the substrate 19 (e.g., along a normal of the surface 192 of the substrate 19).

In some embodiments, electromagnetic waves transmitted or received by the antenna layer 11 and the electromagnetic waves transmitted or received by the antenna layer 16 include the same or similar wavelength. In some embodiments, the electromagnetic waves transmitted by the antenna layer 11 and the electromagnetic waves transmitted by the antenna layer 16 include the same or similar power (or gain). In some embodiments, a pitch D1 between the antenna of the antenna layer 11 (which is closest to the antenna layer 16) and the antenna of the antenna layer 16 (which is closest to the antenna layer 11) is from about 0.5λ to about 0.9λ, where λ represents the wavelength of the electromagnetic wave transmitted or received by the antenna layer 11 or the antenna 16. In addition, the antenna layer 11 and the antenna layer 16 may have the same or similar operating frequency. Therefore, the antenna layer 11 (or a portion of the antenna layer 11) and the antenna layer 16 (or a portion of the antenna layer 16) may be combined into an antenna array.

Figure 1C:
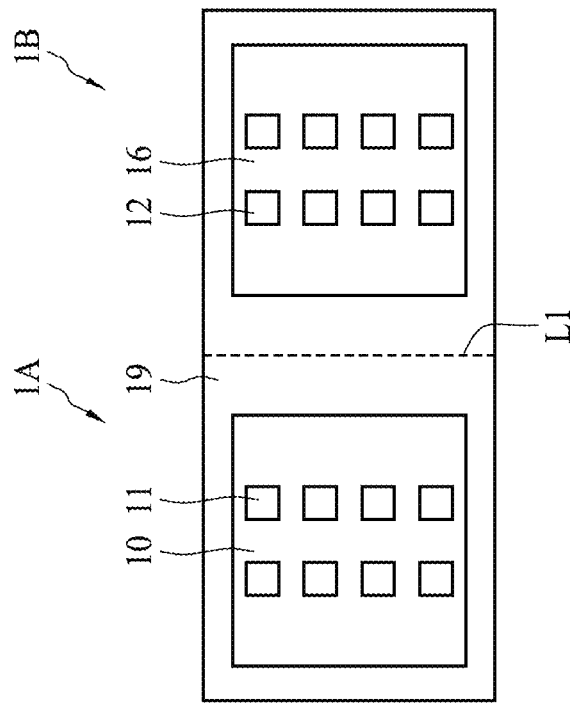
FIG. 1C illustrates a net of the wireless communication module as shown in FIG. 1B, in accordance with some embodiments of the present disclosure.
Figure 1D:
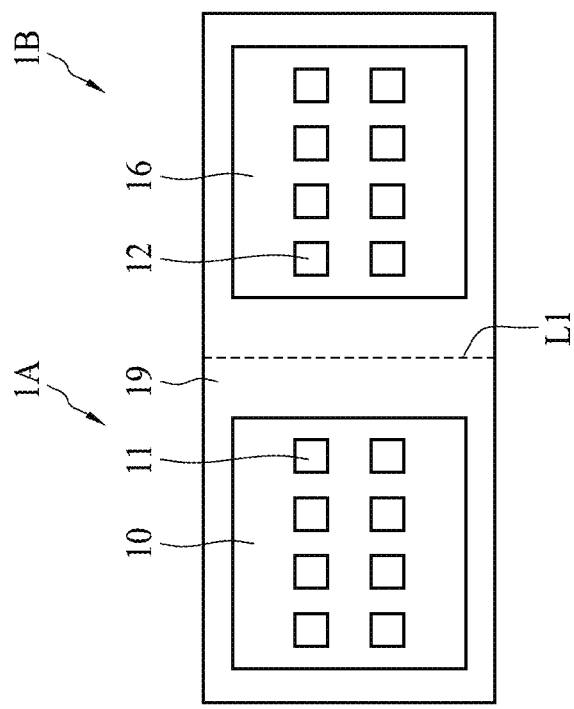
FIG. 1D illustrates a net of the wireless communication module as shown in FIG. 1B, in accordance with some embodiments of the present disclosure.

FIG. 1C and FIG. 1D illustrate top views of the wireless communication module 1 before the substrate 19 has been bent or folded (i.e., a net of the wireless communication module 1), in accordance with some embodiments of the present disclosure. As shown in FIG. 1C and FIG. 1D, the antenna array (e.g., the antenna layer 11) of the antenna module 1A and the antenna array (e.g., the antenna layer 16) of the antenna module 1B have symmetrical arrangement. For example, the antenna array (e.g., the antenna layer 11) of the antenna module 1A and the antenna array (e.g., the antenna layer 16) of the antenna module 1B have a mirror structure with respect to the line L1.

In some embodiments, each of the antenna layer 11 and the antenna layer 16 may include a plurality of antennas (e.g., patch antennas) with a substantially equidistant pitch. The antennas are configured to generate electromagnetic waves with high radiation power if the pitch of two adjacent antennas exceeds half a wavelength of the generated electromagnetic waves. Hence, the antenna layer 11 and the antenna layer 16 can be designed to generate constructive and destructive interference (e.g., far-filed interference) radiated power in a far-field region (e.g., r>>2λ, where r is a distance between the far-field region and the first antenna layer 11 or the second antenna layer 16).

In accordance with the embodiments as shown in FIGS. 1A-1D, the antenna layer 11 of the antenna module 1A and the antenna layer 16 of the antenna module 1B have far-field interference. For example, the electromagnetic waves of the antenna layer 11 of the antenna module 1A and the electromagnetic waves of the antenna layer 16 of the antenna module 1B can be mixed to form electromagnetic waves radiated in a direction between the normal of the surface 191 of the substrate 19 and the normal of the surface 192 of the substrate 19. Hence, the embodiments as shown in FIGS. 1A-1D can achieve multi-directional radiation without increasing the number of the antenna layers.

In some embodiments, the antenna module 1A (or the antenna module 1B) can be manufactured by the following operations: (i) providing the substrate 10; (ii) disposing the antenna layer 11 on the surface 101 of the substrate 10; (iii) disposing the electronic component 12 on the surface 102 of the substrate 10; and (iv) disposing the electrical contact 13 on the surface 102 of the substrate 10. In some embodiments, the wireless communication module 1 can be manufactured by the following operations: (i) disposing the antenna module 1A and the antenna module 1B on a planar surface of the unfolded substrate 19; and (ii) folding the substrate 19 to divide (or separate) the planar surface into the surface 191 and the surface 192 which are non-coplanar with each other.

Figure 2A:
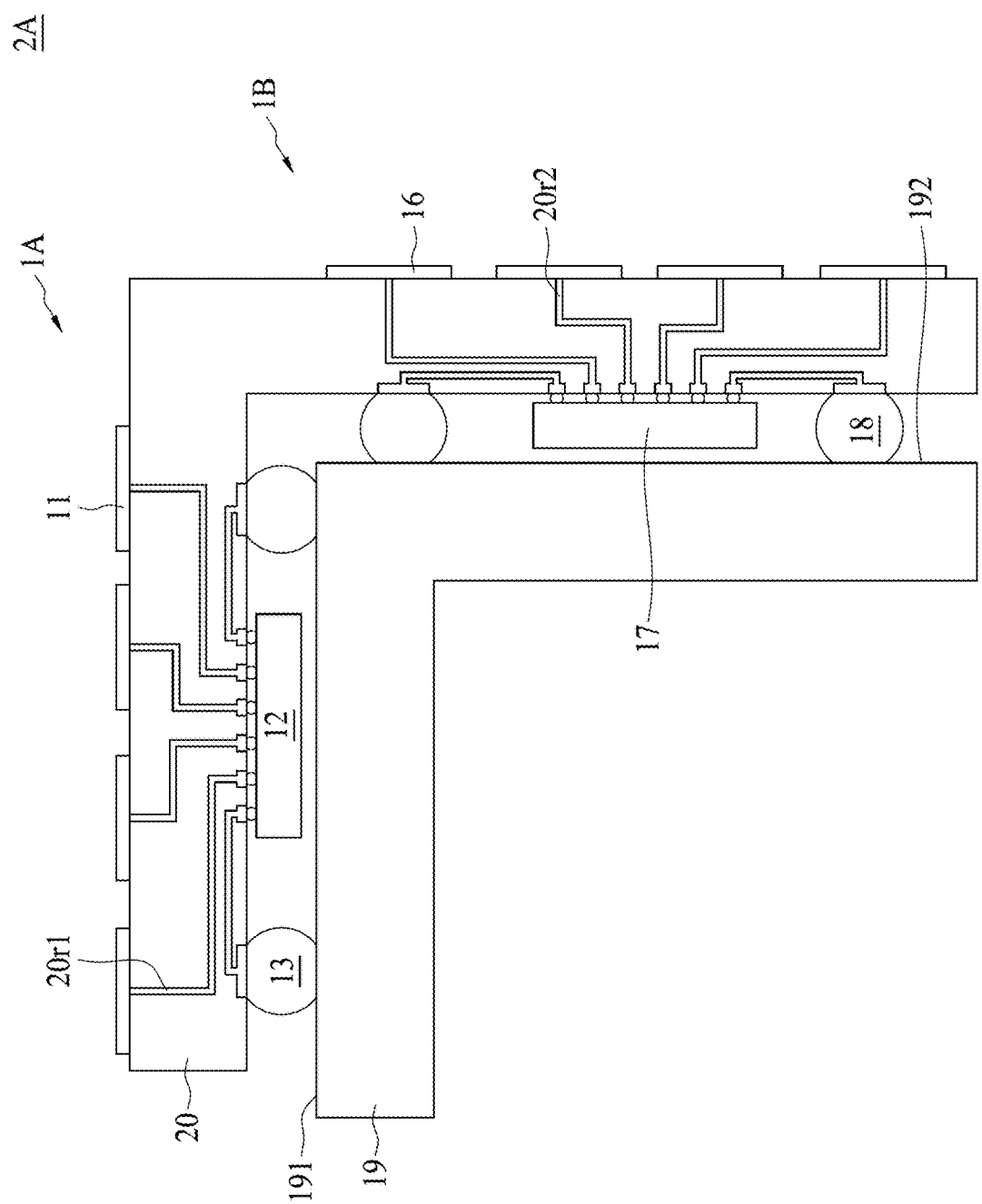
FIG. 2A illustrates a side view of a wireless communication module, in accordance with some embodiments of the present disclosure.

FIG. 2A illustrates a side view of a wireless communication module 2A, in accordance with some embodiments of the present disclosure. In some embodiments, the wireless communication module 1 as shown in FIG. 1A can be replace by the wireless communication module 2A. The wireless communication module 2A is similar to the wireless communication module 1 as shown in FIG. 1B, and some of the differences therebetween are described below.

As shown in FIG. 2A, the antenna module 1A and the antenna module 1B share a substrate 20. The substrate 20 is disposed on the surfaces 191 and 192 of the substrate 19. The substrate 20 may be, for example, a printed circuit board, such as a paper-based copper foil laminate, a composite copper foil laminate, or a polymer-impregnated glass-fiber-based copper foil laminate. The substrate 20 may include an interconnection structures 20r1, 20r2, such as RDLs or grounding elements. For example, the electronic component 12 may be configured to transmit or receive the signal from the antenna layer 11 through the interconnection structure 20r1, and the electronic component 17 may be configured to transmit or receive the signal from the antenna layer 16 through the interconnection structure 20r2. In some embodiments, the substrate 20 may be or include a FPC. Hence, the substrate 20 can be bent or folded as shown in FIG. 2A to be conformal to the shape of the substrate 19. For example, the substrate 20 may extend along the surface 191 of the substrate 19 to exceed the surface 192 and then extend along the surface 192 of the substrate 19.

Figure 2B:
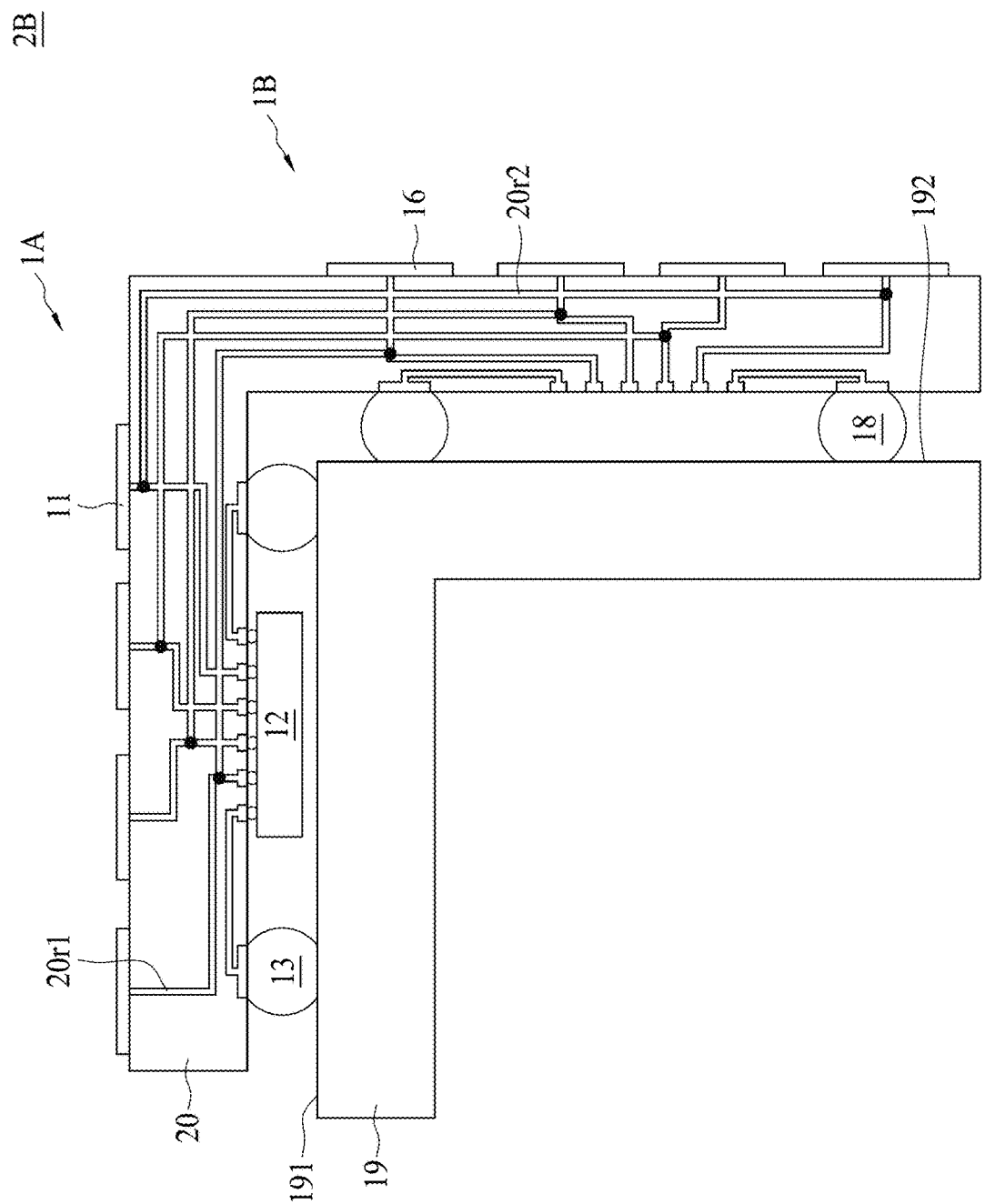
FIG. 2B illustrates a side view of a wireless communication module, in accordance with some embodiments of the present disclosure.

FIG. 2B illustrates a side view of a wireless communication module 2B, in accordance with some embodiments of the present disclosure. In some embodiments, the wireless communication module 1 as shown in FIG. 1A can be replace by the wireless communication module 2B. The wireless communication module 2B is similar to the wireless communication module 2A as shown in FIG. 2A, and some of the differences therebetween are described below.

Unlike FIG. 2A, in which the antenna modules 1A and 1B include individual electronic components (e.g., the electronic components 12 and 17), as shown in FIG. 2B, the antenna modules 1A and 1B share an electronic component (e.g., the electronic component 12). The electronic component 12 can be configured to transmit or to receive the signal from the antenna layer 11 through the interconnection structure 20r1 of the substrate 20. The electronic component 12 can be also configured to transmit or receive the signal from the antenna layer 16 through the interconnection structure 20r2 of the substrate 20.

In accordance with the embodiments as shown in FIG. 2B, since only one electronic component 12 is required, the manufacturing cost and the power consumption of the wireless communication module 2B can be reduced. However, as shown in FIG. 2B, the electronic component 12 is closer to the antenna layer 11 than the antenna layer 16. Therefore, the signal path between the electronic component 12 and the antenna layer 16 is relatively longer compared with the signal path between the electronic component 12 and the antenna layer 11, which would increase the transmission loss between the electronic component 12 and the antenna layer 16.

Figure 2C:
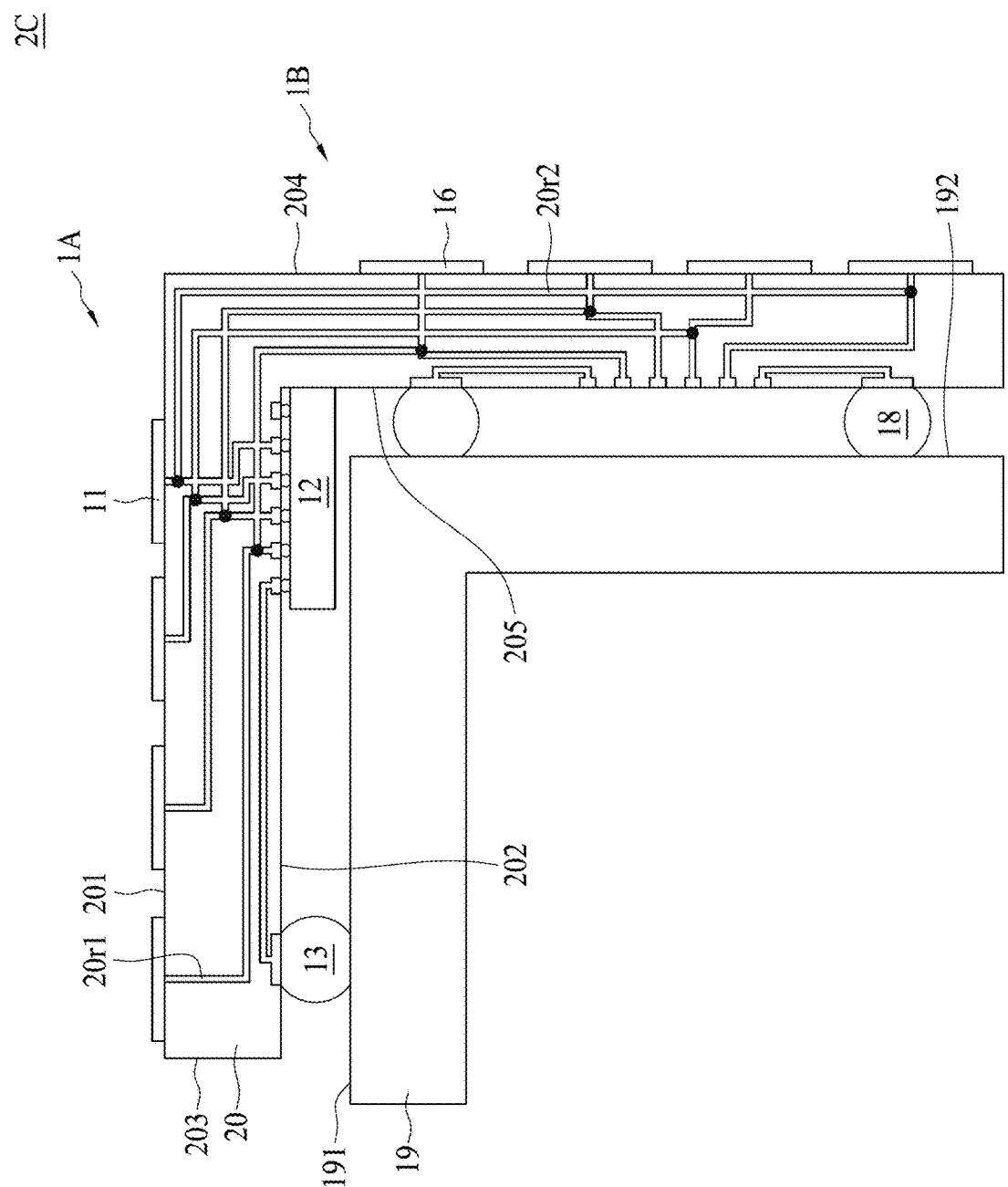
FIG. 2C illustrates a side view of a wireless communication module, in accordance with some embodiments of the present disclosure.

FIG. 2C illustrates a side view of a wireless communication module 2C, in accordance with some embodiments of the present disclosure. In some embodiments, the wireless communication module 1 as shown in FIG. 1A can be replace by the wireless communication module 2C. The wireless communication module 2C is similar to the wireless communication module 2B as shown in FIG. 2B, and some of the differences therebetween are described below.

As shown in FIG. 2C, the electronic component 12 is closer to the antenna layer 16 compared with the electronic component 12 of the wireless communication module 2B. For example, the electronic component 12 is disposed adjacent to the corner of the substrate 20 (e.g., the folded portion of the substrate 20). For example, the electronic component 12 is closer to a surface 205 (which is opposite to a surface 204 on which the antenna layer 16 is disposed) than a surface 203 (which is extended between a surface 201 on which the antenna layer 11 is disposed and a surface 202 on which the electronic component 12 is disposed).

In accordance with the embodiments as shown in FIG. 2C, since the electronic component 12 is closer to the antenna layer 16 compared with the electronic component 12 of the wireless communication module 2B, the transmission loss between the electronic component 12 and the antenna layer 16 can be reduced.

Figure 2D:
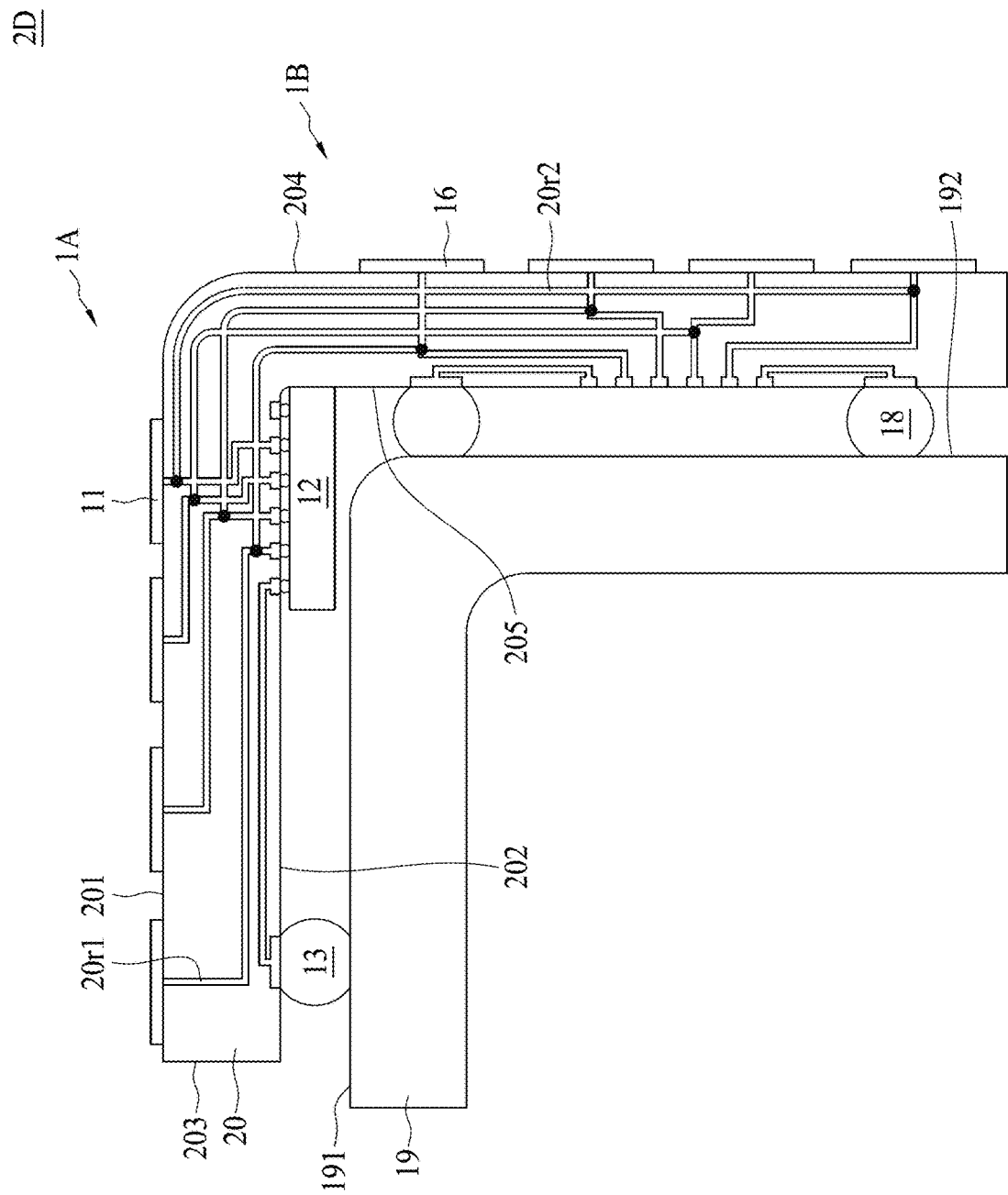
FIG. 2D illustrates a side view of a wireless communication module, in accordance with some embodiments of the present disclosure.

FIG. 2D illustrates a side view of a wireless communication module 2D, in accordance with some embodiments of the present disclosure. In some embodiments, the wireless communication module 1 as shown in FIG. 1A can be replace by the wireless communication module 2D. The wireless communication module 2D is similar to the wireless communication module 2C as shown in FIG. 2C, and some of the differences therebetween are described below.

The corner of the bent or folded portion of the substrate 19 or the substrate 20 has a curved surface. For example, the surface 191 and the surface 192 of the substrate 19 are connected through a curved surface. For example, the surface 201 and the surface 204 of the substrate 20 are connected through a curved surface. In some embodiments, the interconnection structures 20r1 and 20r2 also have curved surfaces adjacent to the corner of the substrate 20. In some embodiments, the substrate 20 as shown in FIG. 2C, which has an angled corner may be formed by a pre-formed process. The antenna layer 11 and the antenna layer 16 may be separated from each other through the angled corner (or turning point). In some embodiments, the substrate 20 as shown in FIG. 2D, which has a curved corner may be formed by providing the substrate 20 and then bending (or folding) the substrate 20. The antenna layer 11 and the antenna layer 16 may be separated from each other through the curved corner (or turning point).

Figure 4B:
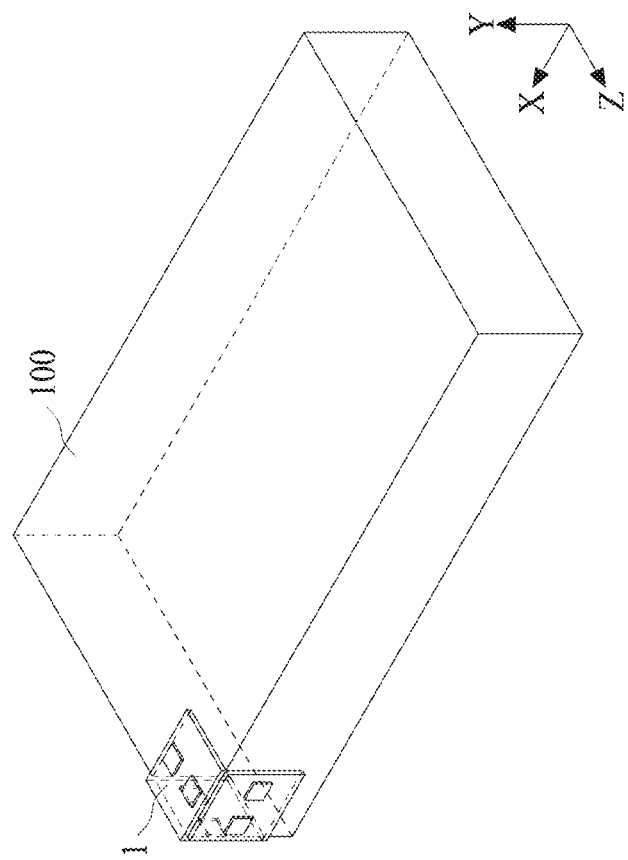
FIG. 4B illustrates a perspective view of an electronic device, in accordance with some embodiments of the present disclosure.
Figure 4A:
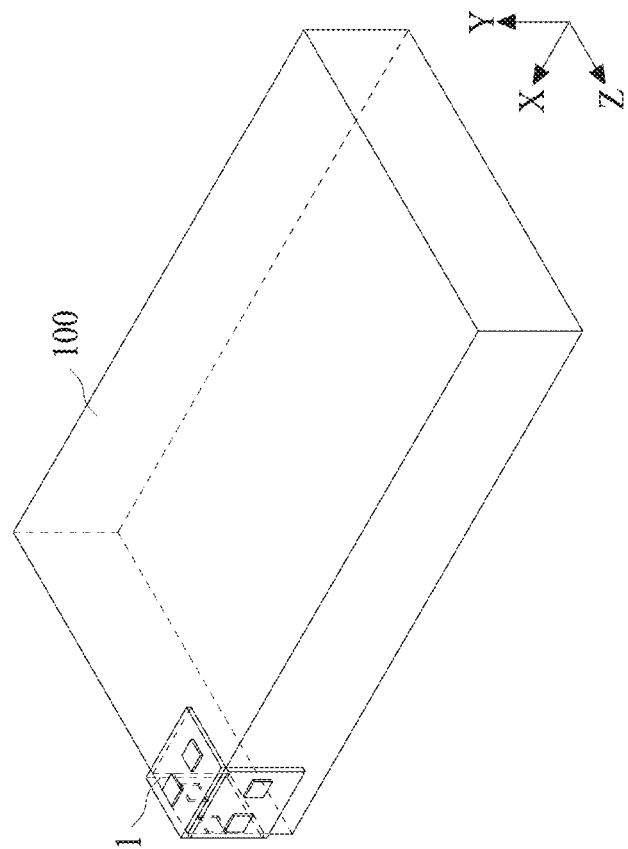
FIG. 4A illustrates a perspective view of an electronic device, in accordance with some embodiments of the present disclosure.
Figure 5B:
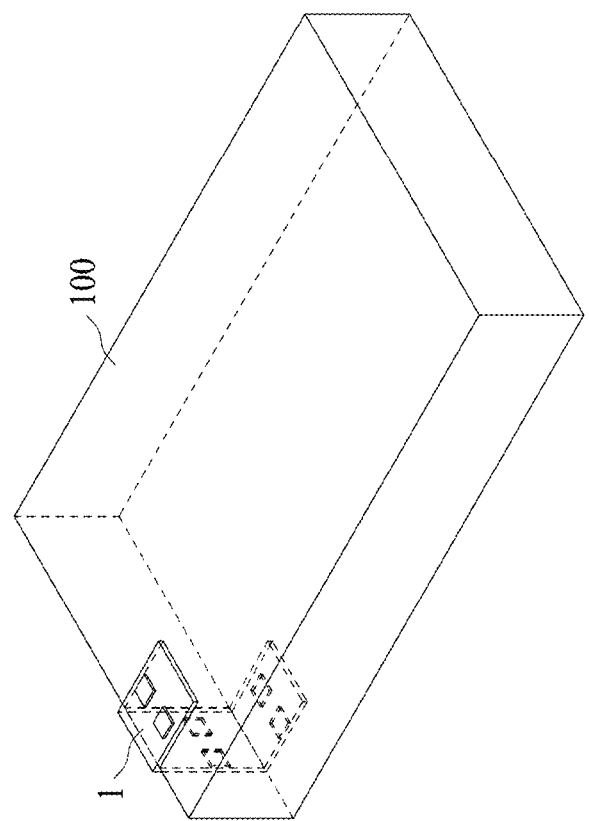
FIG. 5B illustrates a perspective view of an electronic device, in accordance with some embodiments of the present disclosure.
Figure 5A:
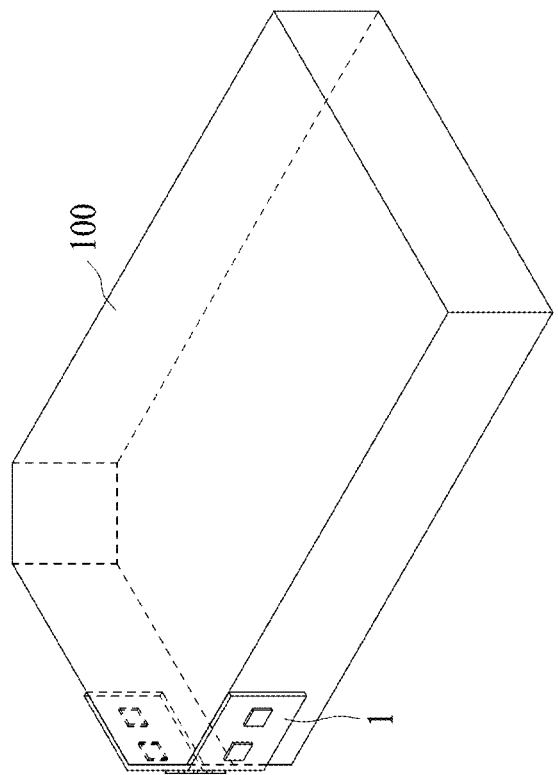
FIG. 5A illustrates a perspective view of an electronic device, in accordance with some embodiments of the present disclosure.

In some embodiments, the wireless communication module 1 can be disposed on more than two surfaces of the electronic device 100. For example, as shown in FIG. 4A and FIG. 4B, the wireless communication module 1 is disposed on three adjacent surfaces (e.g., the surface perpendicular to the x-axis, the surface perpendicular to the y-axis, and the surface perpendicular to the z-axis). For example, as shown in FIG. 5A and FIG. 5B, the wireless communication module 1 can be disposed on three continuous surfaces. In other embodiments, the wireless communication module 1 can be disposed on N surfaces of the electronic device 100 depending on different design specifications, where N is equal to or less than the total number of the faces of the electronic device 100.

FIG. 4C and FIG. 4D illustrate top views of the wireless communication module 1 as shown in FIG. 4A and FIG. 4B before the substrate 19 has been bent or folded (i.e., a net of the wireless communication module 1), in accordance with some embodiments of the present disclosure. The structures as shown in FIG. 4C and FIG. 4D are similar to the structures as shown in FIG. 1C and FIG. 1D, except that the structures as shown in FIG. 4C and FIG. 4D further include an additional antenna module 4C having an antenna layer 41.

As shown in FIG. 4C, the antenna array (e.g., the antenna layer 11) of the antenna module 1A and the antenna array (e.g., the antenna layer 16) of the antenna module 1B have symmetrical arrangement. For example, the antenna array (e.g., the antenna layer 11) of the antenna module 1A and the antenna array (e.g., the antenna layer 16) of the antenna module 1B have a mirror structure with respect to the line L1. Similarly, the antenna array (e.g., the antenna layer 16) of the antenna module 1B and the antenna array (e.g., the antenna layer 41) of the antenna module 4C have a mirror structure with respect to the line L2. However, the antenna array (e.g., the antenna layer 11) of the antenna module 1A and the antenna array (e.g., the antenna layer 41) of the antenna module 4C do not have a mirror structure with respect to an interface between the antenna module 4C and the antenna module 1A after the substrate 19 has been folded.

Therefore, the far-filed interference would occur between the antenna layer 11 and the antenna layer 16 and between the antenna layer 16 and the antenna layer 41. The antenna layer 11 and the antenna layer 41 do not have far-filed interference. In other words, the electromagnetic waves of the antenna layer 11 and the electromagnetic waves of the antenna layer 16 can be mixed to form electromagnetic waves radiated in a direction between the z-axis and the y-axis, and the electromagnetic waves of the antenna layer 16 and the electromagnetic waves of the antenna layer 41 can be mixed to form electromagnetic waves radiated in a direction between the y-axis and the x-axis.

As shown in FIG. 4D, the antenna array (e.g., the antenna layer 11) of the antenna module 1A and the antenna array (e.g., the antenna layer 41) of the antenna module 4C have symmetrical arrangement after the substrate 19 has been folded. For example, the antenna array (e.g., the antenna layer 11) of the antenna module 1A and the antenna array (e.g., the antenna layer 41) of the antenna module 4C have a mirror structure with respect to the interface between the antenna module 4C and the antenna module 1A after the substrate 19 has been folded. Similarly, the antenna array (e.g., the antenna layer 16) of the antenna module 1B and the antenna array (e.g., the antenna layer 41) of the antenna module 4C have a mirror structure with respect to the line L2. However, the antenna array (e.g., the antenna layer 11) of the antenna module 1A and the antenna array (e.g., the antenna layer 16) of the antenna module 1B do not have a mirror structure with respect to the line L1.

Therefore, the far-filed interference would occur between the antenna layer 11 and the antenna layer 41 and between the antenna layer 16 and the antenna layer 41. The antenna layer 11 and the antenna layer 16 do not have far-filed interference. In other words, the electromagnetic waves of the antenna layer 11 and the electromagnetic waves of the antenna layer 41 can be mixed to form electromagnetic waves radiated in a direction between the z-axis and the x-axis, and the electromagnetic waves of the antenna layer 16 and the electromagnetic waves of the antenna layer 41 can be mixed to form electromagnetic waves radiated in a direction between the y-axis and the x-axis.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A wireless communication module, comprising:
   a carrier including a first surface and a second surface non-parallel with the first surface;
   a substrate comprising a first portion disposed over the first surface of the carrier and a second portion disposed over the second surface of the carrier, the first portion including a first antenna layer, and the second portion including a second antenna layer,
   wherein the first antenna layer is configured to radiate a first electromagnetic wave in a first direction, and the second antenna layer is configured to radiate a second electromagnetic wave in a second direction,
   wherein the first antenna layer and the second antenna layer are collectively configured as a first antenna array to transmit or receive a third electromagnetic wave through far-field interference between the first electromagnetic wave and the second electromagnetic wave in a third direction different from the first direction and the second direction,
   wherein the first antenna layer includes a first patterned antenna and a second patterned antenna, the first patterned antenna is closest to the second antenna layer,
   wherein the second antenna layer includes a third patterned antenna which is closest to the first antenna layer, and
   wherein a first pitch between the first patterned antenna and the third patterned antenna is in a range from 0.5λ to 0.9λ, and substantially equal to a second pitch between the first patterned antenna and the second patterned antenna of the first antenna layer.

2. The wireless communication module of claim 1, wherein the carrier includes a folded portion connecting the first surface with the second surface, wherein the substrate is conformally disposed over the first surface, the second surface, and the folded portion of the carrier, and
   wherein the wireless communication module further comprises:
   an electronic component disposed between the carrier and the substrate, and
   wherein the electronic component is configured to control or determine a phase of a signal transmitted to each of the first patterned antenna and the second patterned antenna of the first antenna layer.

3. The wireless communication module of claim 2, wherein the folded portion has a curve surface connecting the first surface with the second surface.

4. The wireless communication module of claim 1, further comprising:
   a third antenna layer disposed over a third surface of the carrier different from the first surface and the second surface,
   wherein the first antenna layer, the second antenna layer, and the third antenna layer are configured to transmit or receive a plurality of electromagnetic waves in at least four directions.

5. The wireless communication module of claim 4, wherein the second antenna layer and the third antenna layer are collectively configured as a second antenna array to transmit or receive a fourth electromagnetic wave through far-field interference between the second electromagnetic wave and the third electromagnetic wave in a fourth direction different from the first direction, the second direction and the third direction.

6. The wireless communication module of claim 4, wherein the first antenna layer and the third antenna layer are collectively configured as a third antenna array to transmit or receive a fifth electromagnetic wave through far-field interference between the first electromagnetic wave and the third electromagnetic wave in a fifth direction different from the first direction, the second direction and the third direction.

7. The wireless communication module of claim 4, wherein at least two surfaces of the first surface, the second surface, and the third surface of the carrier are non-orthogonal to each other.

8. The wireless communication module of claim 4, wherein at least two surfaces of the first surface, the second surface, and the third surface of the carrier are substantially parallel with each other.

\* \* \* \* \*